(12) United States Patent
Sperl

(10) Patent No.: US 9,872,420 B1
(45) Date of Patent: Jan. 16, 2018

(54) SHIELDING BOX FOR PROVIDING HIGH FREQUENCY ELECTROMAGNETIC SHIELDING

(71) Applicant: Rohde & Schwarz GmbH & Co. KG, Munich (DE)

(72) Inventor: Ludwig Sperl, Langdorf (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/237,090

(22) Filed: Aug. 15, 2016

(51) Int. Cl.
| H05K 5/00 | (2006.01) |
| H05K 9/00 | (2006.01) |
| H05K 5/02 | (2006.01) |
| H02B 1/38 | (2006.01) |

(52) U.S. Cl.
CPC ............. *H05K 9/0016* (2013.01); *H02B 1/38* (2013.01); *H05K 5/0226* (2013.01)

(58) Field of Classification Search
CPC ....... H05K 5/0226; H05K 9/0016; H02B 1/38
See application file for complete search history.

(56) References Cited

U.S. PATENT DOCUMENTS

| 5,474,309 A * | 12/1995 | Balsells | H05K 9/0016 174/351 |
| 6,318,824 B1 * | 11/2001 | LaGrotta | E05D 3/022 312/322 |
| 2015/0318678 A1 * | 11/2015 | Ketterer | H05K 5/0226 220/3.8 |
| 2016/0359305 A1 * | 12/2016 | Hemingway | H02G 3/081 |

* cited by examiner

*Primary Examiner* — Hung V Ngo
(74) *Attorney, Agent, or Firm* — Shwabe, Williamson & Wyatt

(57) ABSTRACT

A shielding box for providing high frequency electromagnetic shielding where a first housing part and a second housing part are connected to each other by a hinge so as to be displaceable between an open position and a closed position. Further, a lifting mechanism is used which has at least one lifting stud and at least one guide, the guide being mounted to one of the housing parts and the lifting stud being mounted to the guide so as to be displaceable between an extended position and a retracted position in a direction which is generally perpendicular to a plane along which the first and second housing parts abut at each other in the closed position. The lifting stud is adapted for displacing the other one of the housing parts.

16 Claims, 6 Drawing Sheets

SHIELDING BOX FOR PROVIDING HIGH FREQUENCY ELECTROMAGNETIC SHIELDING

The invention relates to a shielding box for providing high frequency electromagnetic shielding.

BACKGROUND OF THE INVENTION

Shielding boxes can be used for accommodating measuring equipment so as to provide a shield against electromagnetic radiation. This is in particular relevant for applications where the measuring equipment shall operate without being disturbed by electromagnetic radiation such as those from mobile communications networks.

The shielding box usually consists of two housing parts which can be moved with respect to each other between an open and a closed position. In the open position, access to the interior of the shielding box is possible such that the measuring equipment can be placed within the shielding box. In the closed position, the interior of the shielding box is shielded against electromagnetic radiation.

In most prior art shielding boxes, one of the housing parts is in the form of a lid, cover or door which closes the access to the interior of the second housing part. Typically, a pivoting hinge is used for connecting the two housing parts to each other. Furthermore, a seal is provided along the edges of one of the housing parts so as to seal along those portions where the housing parts abut each other.

In theory, the seal shall be compressed in a uniform manner so as to achieve a good sealing effect and a long lifetime of the seal. The pivotal movement of the two housing parts with respect to each other upon closing of the shielding box however results in an uneven distribution of the loads acting on the seal.

WO 2011/023314 A1 shows a shielding box in which a door cooperating with the main housing part of the shielding box is pressed in a translational manner against the housing part upon closing. This however requires a complex mechanism for carrying and guiding the door.

The object of the invention is to provide a shielding box which ensures a purely translational movement of the two housing parts with respect to each other upon closing without requiring a complex construction.

BRIEF DESCRIPTION OF THE INVENTION

The above-mentioned object is achieved with a shielding box for providing high frequency electromagnetic shielding, comprising a first housing part and a second housing part which are connected to each other by means of a hinge so as to be displaceable between an open position and a closed position, and further comprising a lifting device having at least one housing stud and at least one guide, the guide being mounted to one of the housing parts and the lifting stud being mounted to the guide so as to be displaceable between an extended position and a retracted position in a direction which is generally perpendicular to a plane along which the first and second housing parts abut at each other in the closed position, the lifting stud being adapted for displacing the other one of the housing parts.

The invention is based on the concept of dividing the process of opening the shielding box (and vice versa closing the shielding box) into two stages. In a first stage, one of the housing parts is lifted from the other of the housing parts by means of the lifting mechanism. In a second stage, the housing parts can be pivoted with respect to each other because of the provision of the hinge. During closing, the housing parts are first pivoted towards an almost closed position. Thereafter, the two housing parts are approached to each other along a straight direction which is generally perpendicular to the plane along which the first and second housing parts abut at each other. Thus, the seal is compressed in a uniform manner along the entire edge between the two housing parts.

Preferably, two different types of lifting studs are provided. A first type of lifting studs is provided with a first hinge element cooperating with a second hinge element, the second hinge element being mounted at the other one of the two housing parts. In other words, the lifting mechanism displaces the entire hinge, thereby separating the two housing parts at the side where the hinge is provided, from each other during opening or approaching the housing parts towards each other during closing.

Preferably, a direction of displacement of the lifting stud relative to the guide is oriented radially with respect to a hinge axis around which the first and second hinge elements can pivot with respect to each other. This construction prevents eccentric loads from acting on the lifting stud.

A second type of lifting stud is provided with an abutment surface which is adapted for cooperating with the other of the housing parts at a side which is opposite the side where the hinge is arranged. The second type of lifting stud ensures that the "second" side of the housing is moved in parallel with the side where the hinge is provided. According to a preferred embodiment, a control slider is provided which is mounted so as to be displaceable between a closing position and a lifting position, the control slider cooperating with the lifting stud. The control slider is used for very effectively achieving the desired displacement of the lifting stud.

Preferably, the control slider has a lifting cam which cooperates with the lifting stud, the lifting cam having a holding portion for holding the lifting stud in an extended position. The holding portion of the lifting cam preferably is oriented along a plane which is perpendicular to the direction of displacement of the lifting stud, thereby requiring no additional latch or brake for holding the lifting stud in the extended position.

The lifting cam further preferably has a displacement portion for displacing the lifting stud between an extended position and a retracted position, and vice versa. The displacement portion very effectively transmits a sliding movement of the control slider into a displacement of the lifting stud between the extended and the retracted position.

Preferably, the displacement portion extends along a straight line. This results in a constant displacement of the two housing parts with respect to each other upon actuation of the control slider.

In order to reduce the friction in the lifting mechanism, the lifting stud is preferably provided with a roller bearing for cooperating with the lifting cam.

According to a preferred embodiment, a latching cam is arranged at the control slider, the latching cam being adapted for engaging at a latching stud mounted to the cover. The latching cam and the latching stud together form a latching mechanism which is transferred between an open and a latched condition simply by displacing the control slider used for lifting or lowering one of the housing parts with respect to the other housing part. Thus, the latching mechanism adds a third stage to the process of closing the shielding box, namely a stage in which the two housing parts are drawn towards each other so as to reliably abut at each other.

In order to be able to arrange the latching studs at the outer edges of the housing parts, two different types of control sliders are used. In a first type, a lifting cam is provided which cooperates with the lifting stud, the latching cam opening to a side which faces away from the lifting cam. In a second type, the latching cam opens to a side which is directed towards the lifting cam.

Preferably, a linear drive is provided for displacing the control slider. The linear drive allows achieving the desired linear motion of the control slider without requiring a complicated structure.

According to a preferred embodiment, the linear drive comprises a tooth rack and a pinion engaging into the tooth rack. The pinion can for example be rotated manually by using a lever.

Preferably, a plurality of guides with lifting studs is arranged along opposite sides of the housing part, with a plurality of control sliders being arranged along two opposite sides of the housing part, the linear drive cooperating with the control slider such that they are displaced simultaneously. Simultaneous displacement of the control sliders guarantees that the two housing parts are moved with respect to each other in a purely translational manner.

For achieving the desired shielding against electromagnetic radiation, a seal is preferably provided for sealing between the housing parts, with the seal being spring biased. As a result of the two housing parts being moved with respect to each other with a translational movement, a long lifetime of the seal is achieved.

In accordance with a preferred embodiment of the invention, the plane along which the first and second housing parts abut at each other in the closed position is oriented horizontally.

BRIEF DESCRIPTION OF THE DRAWINGS

The invention will now be described with reference to the accompanying drawings. In the drawings.

DETAILED DESCRIPTION OF THE INVENTION

Figure 1:
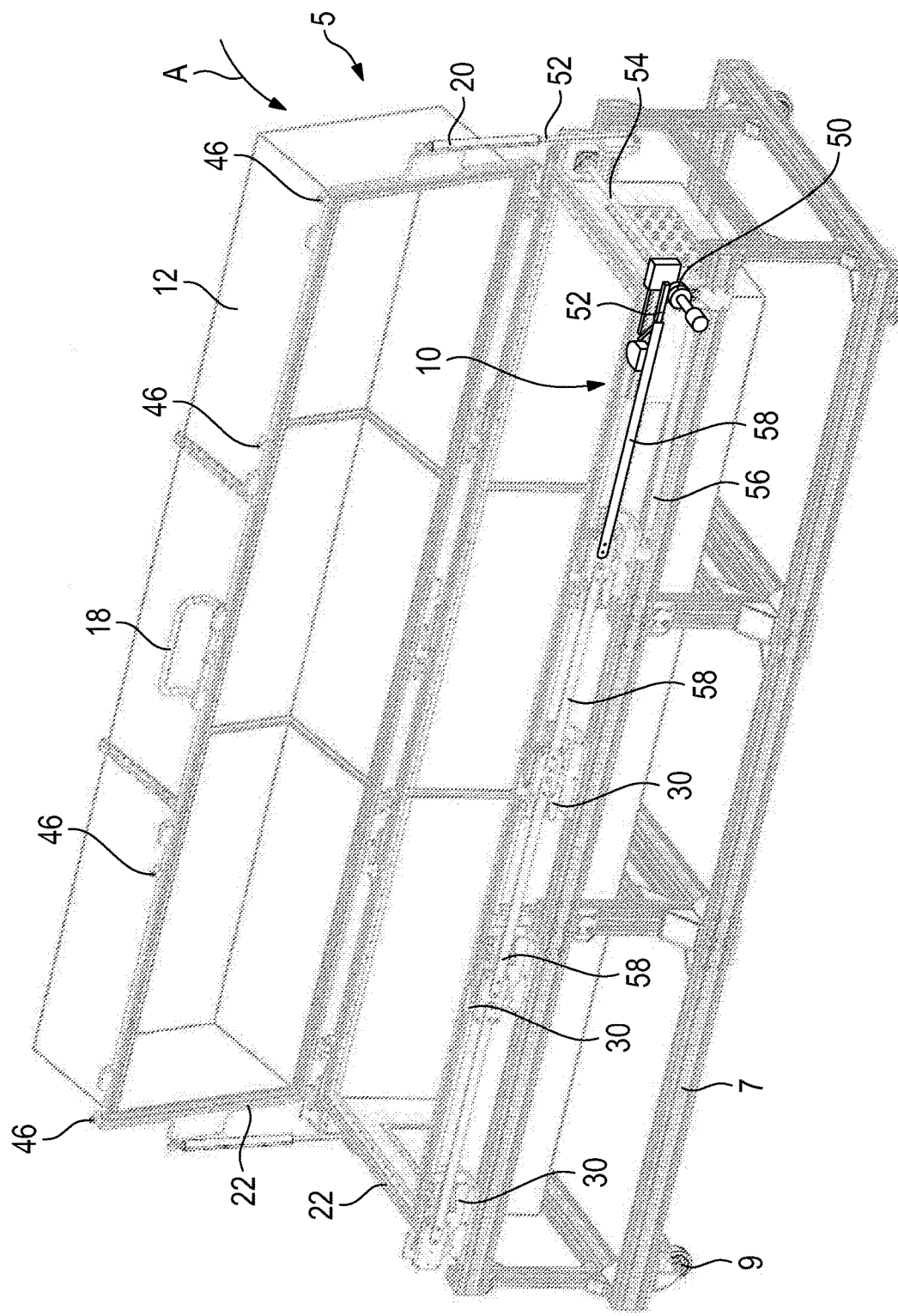
FIG. 1 shows in a perspective view a shielding box in an opened condition.

In FIG. 1, a shielding box 5 is shown. It comprises two housing parts 10, 12 which delimit in their interior a space in which measuring equipment can be placed. The shielding box here is arranged in a movable support 7 provided with wheels 9.

The two housing parts 10, 12 are made from a material with good electric conductivity. Sheet metal is an example for such material. In the embodiment shown, housing part 10 is in the form of a tray-like bottom part or underside, and housing part 12 is in the form of an upper part or cover.

Housing parts 10, 12 are connected to each other by means of a hinge formed from two hinge elements 14, 16 (please see FIGS. 2 and 3) which are arranged along the edges of the housing parts 10, 12 adjoining each other in an open condition of shielding box 5. Shielding box 5 can be transferred into a closed condition by pivoting housing part 12 in the direction of arrow A in FIG. 1, for example by engaging at a handle 18 for closing housing part 12 against the action of a gas-pressurized spring 20.

In the closed condition, housing parts 10, 12 abut at each other in a plane which is here arranged horizontally. Along the edges of housing part 10 facing housing part 12 and/or along the edges of housing part 12 facing housing part 10, a seal 22 is arranged for achieving an electromagnetic seal between the two housing parts 10, 12. Seal 22 is spring-biased so as to provide the desired elasticity. The process of transferring shielding box 5 from the open condition shown in FIG. 1 into a closed condition comprises several stages. In a first stage, housing part 12 is pivoted around the axis defined by cooperating hinge elements 14, 16 until the lower edge of housing part 12 and the upper edge of housing part 10 are arranged in parallel and opposite each other, but spaced from each other by a distance in the order of 5 to 25 mm. In a second stage, the upper housing part 12 is made to descend towards lower housing part 10 in a purely translational direction. In other words, the four corners of the lower edge of housing part 12 are displaced simultaneously at the same speed and in the same direction. This ensures that seal 22 is compressed in a uniform manner. In a third stage, upper housing part 12 is actively drawn towards lower housing part 10 until the two housing parts 10, 12 are firmly attached to each other so that seal 22 is compressed with a force required for achieving the desired electromagnetic shielding.

For achieving other translational movement of the second housing part 12 with respect to the first housing part 10 and for actively drawing the two housing parts towards each other, a lifting mechanism is provided which will be explained with reference to FIGS. 2 to 6.

Stated in a general manner, there is a first type of lifting mechanism which is used for lifting the hinge axis around which hinge elements 14, 16 pivot with respect to each other, and a second type of lifting mechanism is provided for supporting the edge of upper housing part 12 on the side which is opposite the side where the hinges are arranged.

Figure 2:
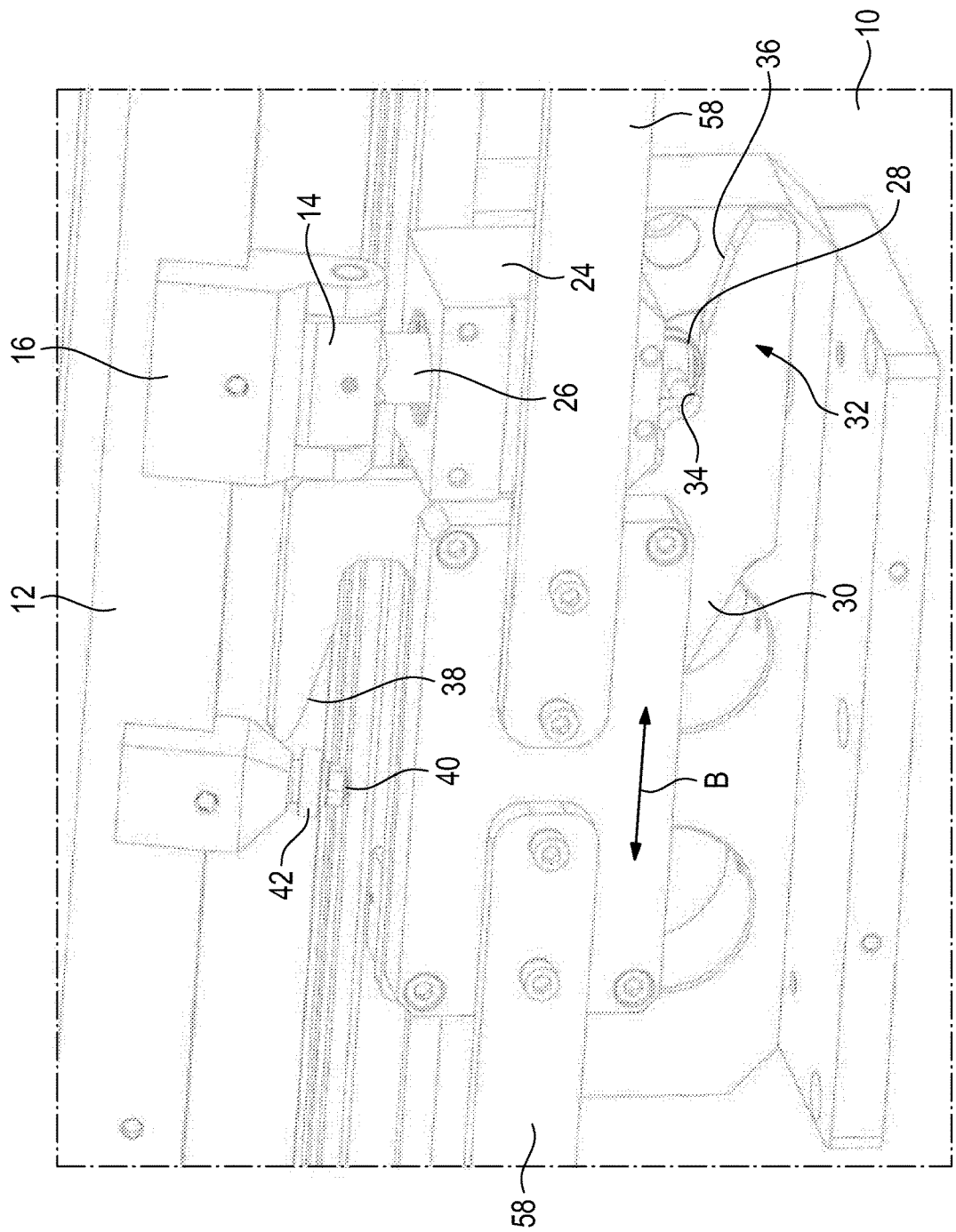
FIG. 2 shows the lifting mechanism on the hinge side of the shielding box, with the shielding box being in an open condition.
Figure 3:
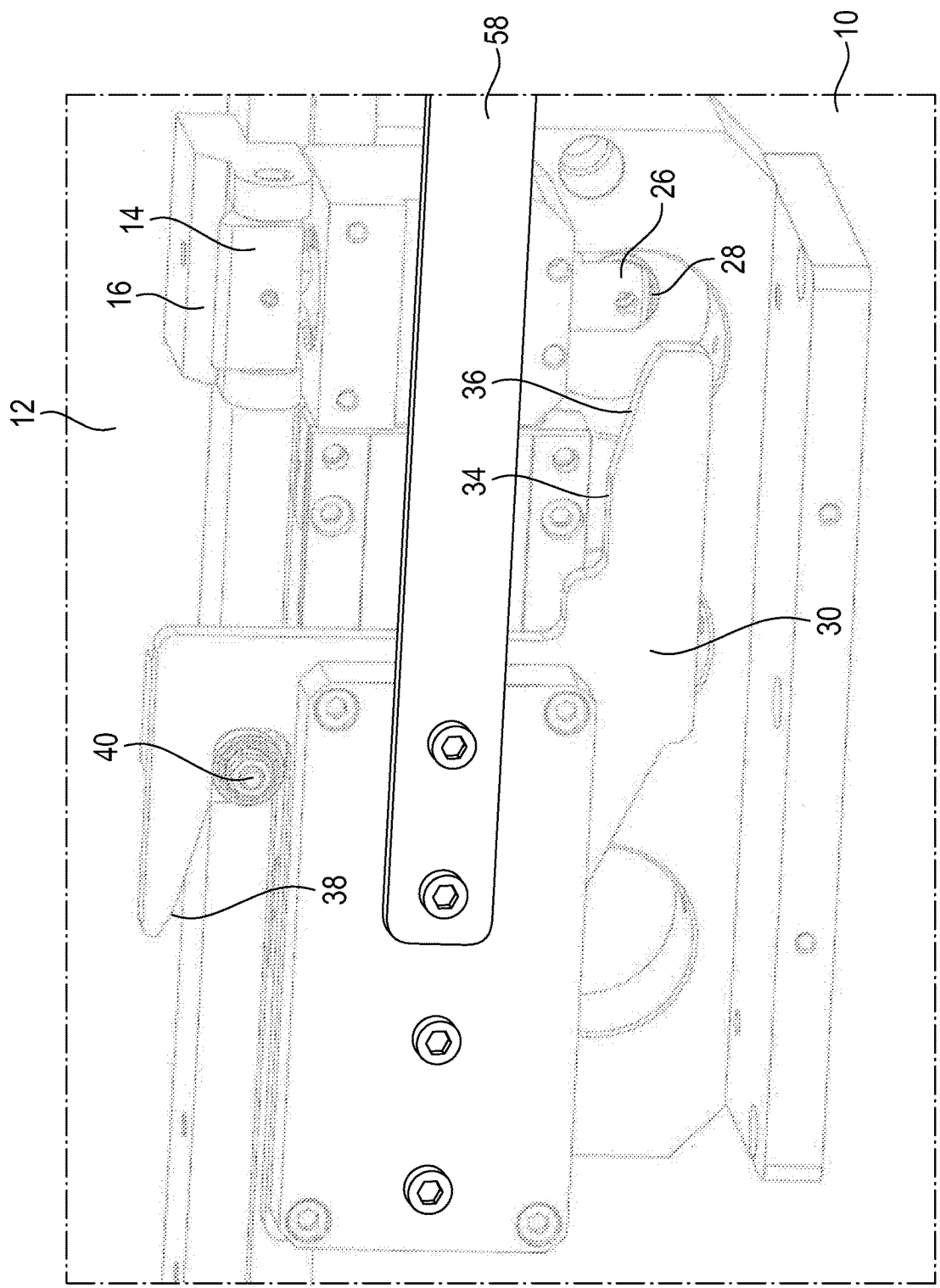
FIG. 3 shows the lifting mechanism of FIG. 2 with the shielding box being in a closed condition.

FIGS. 2 and 3 show the lifting mechanism on the hinge side.

The hinge mechanism comprises a guide 24 which is mounted to lower housing part 10. It further comprises a lifting stud 26 which is guided within guide 24 so as to be displaceable in a translational manner. Specifically, lifting stud 26 is displaceable vertically and thus perpendicularly with respect to the plane along which the edges of lower and upper housing parts 10, 12 abut at each other.

At the upper end of lifting stud 26, hinge element 14 is mounted. Hinge element 16 is connected to upper housing part 12.

At the lower end of lifting stud 26, a roller bearing 28 is mounted. In the alternative, a wheel can be used here.

Roller bearing 28 cooperates with a control slider 30 which is mounted displaceably on lower housing part 10. The direction of displacement (see arrow B in FIG. 2) extends in parallel with the plane along which lower and upper housing parts 10, 12 abut at each other in the closed condition of shielding box 5.

Control slider 30 is provided with a lifting cam 32 on which roller bearing 28 sits. Lifting cam 32 comprises a holding portion 34 which extends horizontally and thus in parallel with direction B. Lifting cam 32 further comprises a displacement portion which extends obliquely with respect to holding portion 34. Specifically, displacement portion 36 starts at the end of holding portion 34 and descends therefrom towards an outer end of control slider 30.

For drawing housing parts 10, 12 towards each other, a latching mechanism is provided. The latching mechanism comprises a latching cam 38 which is formed on control slider 30, and a latching stud 40 which is provided on upper housing part 12. A roller bearing 42 is here mounted on latching stud 40 for reducing friction.

Figure 5:
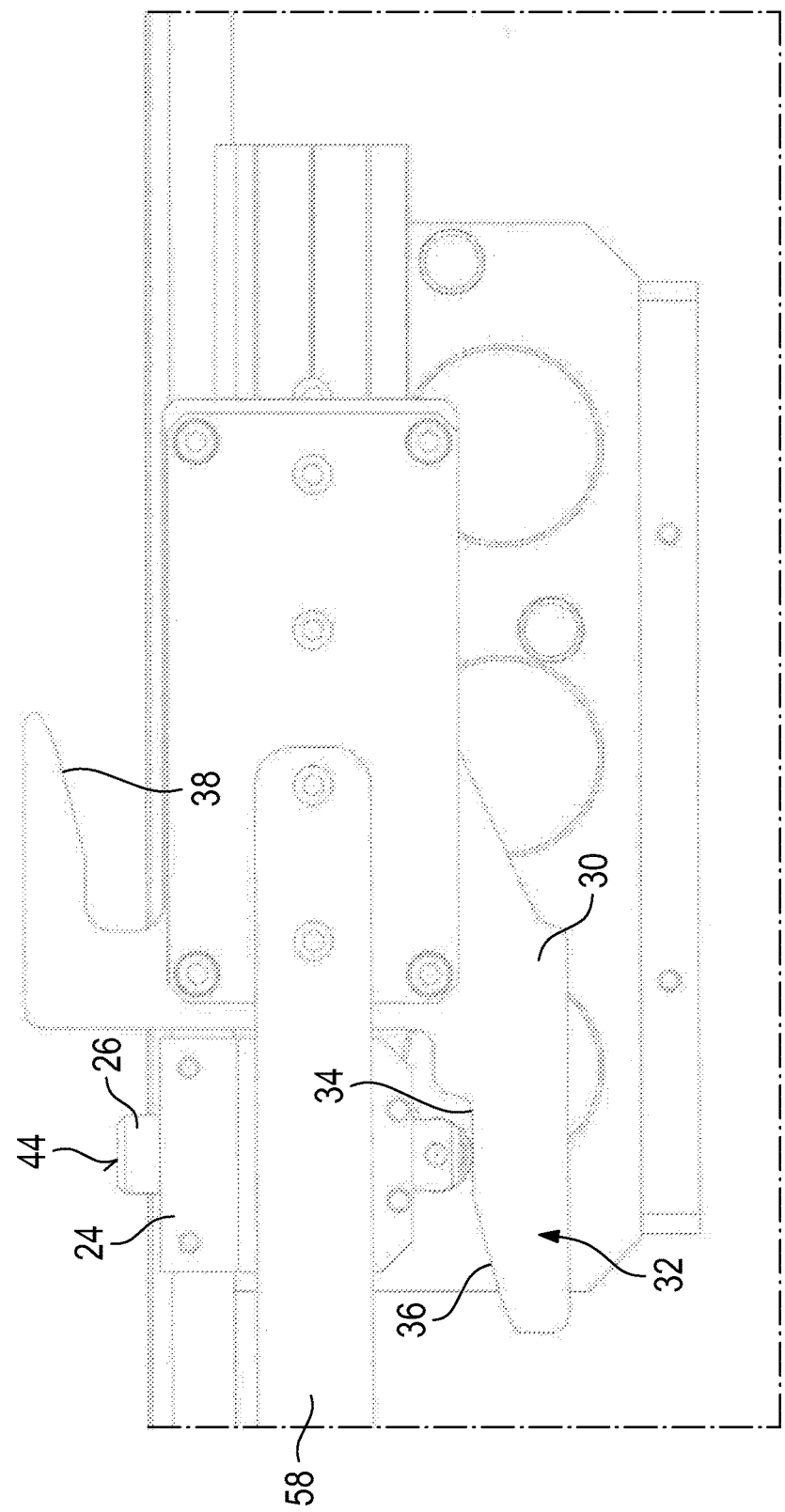
FIG. 5 shows a lifting mechanism on a side opposite the hinge side of the shielding box, with the lifting mechanism being in an open condition.

A second type of lifting mechanism is shown in FIG. 5. The design is generally similar to the design of the lifting mechanism shown in FIG. 2. Thus, the same reference numerals are being used for the same elements, and reference is made to the above comments. The difference between the first and the second type of lifting mechanisms is that at the second type, the upper end of lifting stud 26 is formed as an abutment surface 44 while at the first type, hinge element 14 is provided at the upper end of lifting stud 26.

When upper housing part 12 is displaced towards the closed condition, it can be pivoted downwards until its edge opposite the hinge side is stopped by contacting abutment surface 44. In this condition, upper housing part 12 is held in a certain distance above lower housing part 10 but parallel thereto. Then, control sliders 30 are displaced (towards the left in FIG. 2 and towards the right in FIG. 5) so that displacement portion 36 of lifting cam 32 allows lifting stud 26 to descend from the extended position shown in FIGS. 2 and 5, towards a retracted position shown in FIGS. 3 and 6. This results in upper housing part 12 being approached towards lower housing part 10 with a translational displacement.

At a certain point, upper housing part 12 is supported by lower housing part 10, and lifting stud 26 is disengaged from lifting cam 32. Continued displacement of control slider 30 makes latching cam 38 engage at latching stud 40 so that the housing parts 10, 12 are drawn towards each other until finally, a completely closed and latched condition is achieved, with control sliders 30 being in the positions shown in FIGS. 3 and 6.

Figure 6:
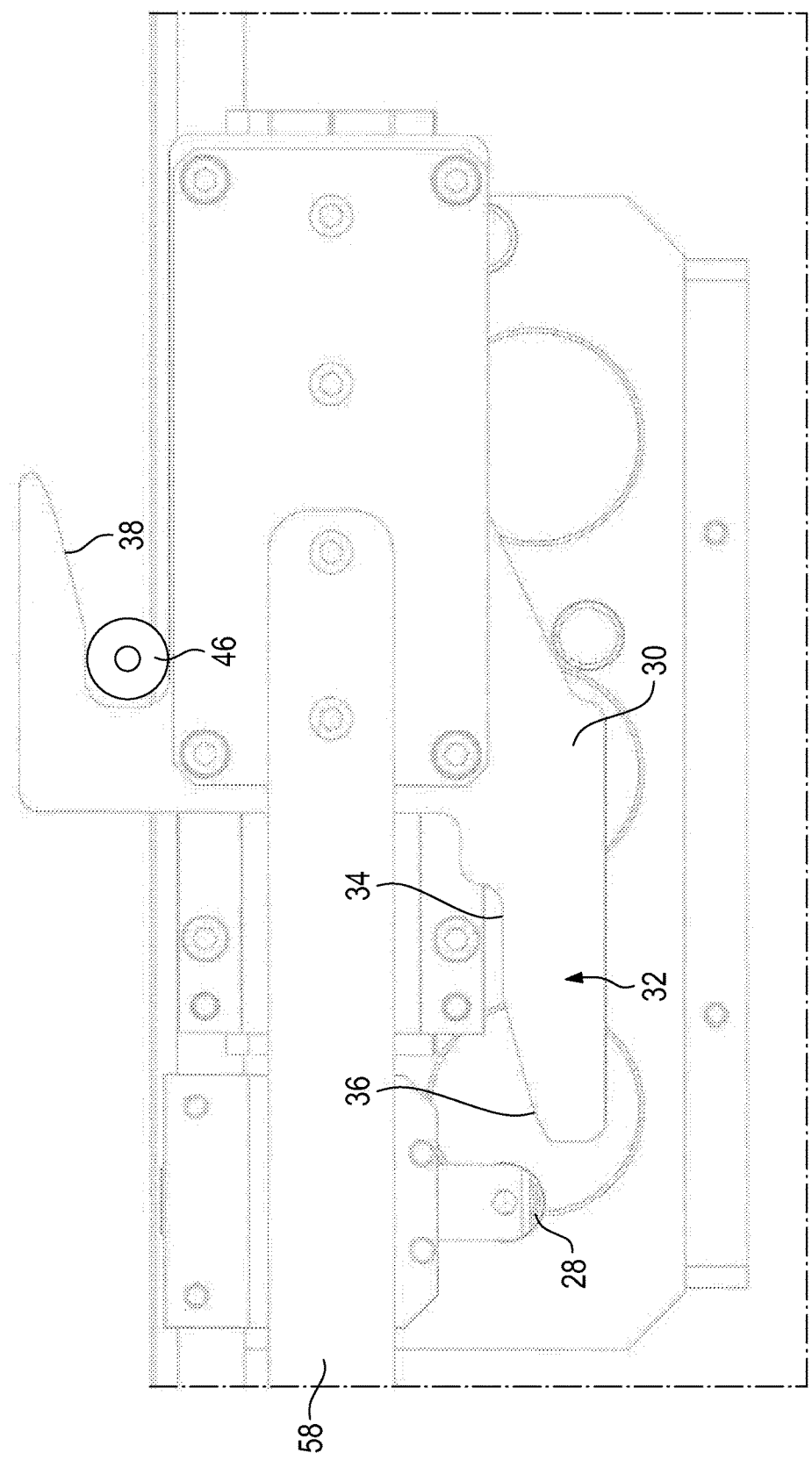
FIG. 6 shows the lifting mechanism of FIG. 5 in a closed condition.

In FIG. 6, a latching stud 46 is schematically shown which is engaged by latching cam 38 and which is arranged along the edge of upper housing part 12 which is opposite the hinge side of the housing part.

For displacing control sliders 30 simultaneously, a linear drive is provided which comprises a pinion 50 and a tooth rack 52 at each side of shielding box 5. Pinions 50 are arranged on a common drive shaft 54 which can be rotated by means of a lever. The displacement of tooth rack 52 is transmitted to the control sliders 30 by means of a connection linkage 58.

Figure 4:
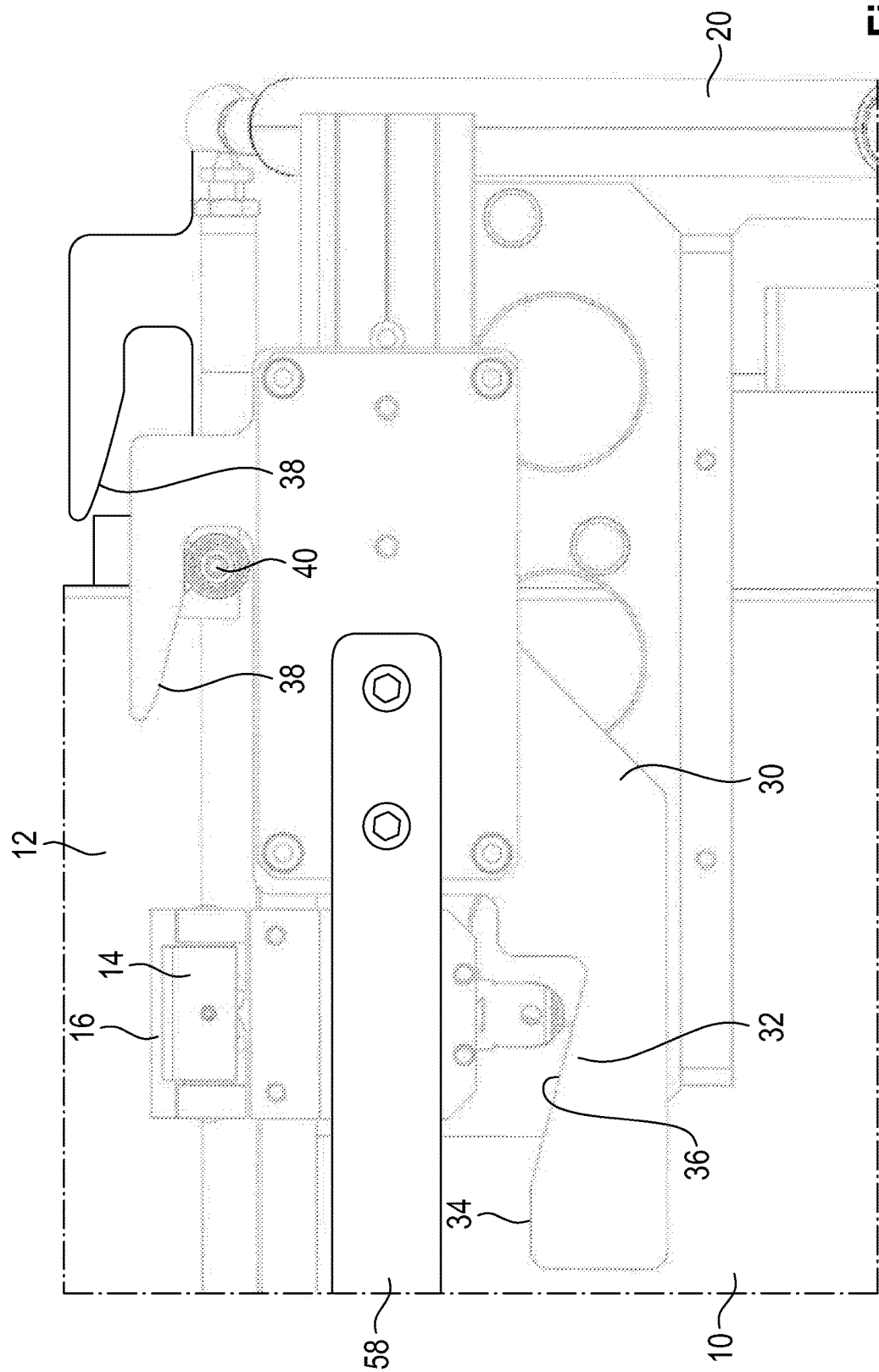
FIG. 4 shows a lifting mechanism on the hinge side of the shielding box with a second type of control slider, the shielding box being in a closed condition.

In FIG. 4, a second type of control slider 30 for the hinge side of the lifting mechanism is shown. The difference over the type shown in FIGS. 2 and 3 is that latching cam 38 faces lifting cam 32 rather than facing away from lifting cam 32. The second type of control slider 30 is used for engaging at a latching stud 40 arranged adjacent one of the corners of upper housing part 12.

The invention claimed is:

1. A shielding box for providing high frequency electromagnetic shielding, comprising a first housing part and a second housing part which are connected to each other by means of a hinge so as to be displaceable between an open position and a closed position, and further comprising a lifting mechanism having at least one lifting stud and at least one guide, the guide being mounted to one of the housing parts and the lifting stud being mounted to the guide so as to be displaceable between an extended position and a retracted position in a direction which is generally perpendicular to a plane along which the first and second housing parts abut at each other in the closed position, the lifting stud being adapted for displacing the other one of the housing parts, wherein a control slider is mounted to be displaceable between a closing position and a lifting position, the control slider cooperating with the lifting stud.

2. The shielding box of claim 1 wherein the lifting stud is provided with a first hinge element cooperating with a second hinge element, the second hinge element being mounted at the other one of the housing parts.

3. The shielding box of claim 1 wherein a direction of displacement of the lifting stud relative to the guide is oriented radially with respect to a hinge axis around which the first and second hinge elements can pivot with respect to each other.

4. The shielding box of claim 1 wherein the lifting stud is provided with an abutment surface which is adapted for cooperating with the other one of the housing parts at a side which is opposite the side where the hinge is arranged.

5. The shielding box of claim 1 wherein the control slider has a lifting cam which cooperates with the lifting stud, the lifting cam having a holding portion for holding the lifting stud in an extended position.

6. The shielding box of claim 5 wherein the lifting cam has a displacement portion for displacing the lifting stud between an extended position and a retracted position, and vice versa.

7. The shielding box of claim 6 wherein the displacement portion extends along a straight line.

8. The shielding box of claim 5 wherein the lifting stud is provided with a roller bearing for cooperating with the lifting cam.

9. The shielding box of claim 1 wherein a latching cam is arranged at the control slider, the latching cam being adapted for engaging at a latching stud mounted to one of the housing parts.

10. The shielding box of claim 9 wherein a lifting cam is provided which cooperates with the lifting stud, the latching cam opening to a side which faces away from the lifting cam.

11. The shielding box of claim 9 wherein a lifting cam is provided which cooperates with the lifting stud, the latching cam opening to a side which is directed towards the lifting cam.

12. The shielding box of claim 1 wherein a linear drive is provided for displacing the control slider.

13. The shielding box of claim 12 wherein the linear drive comprises a tooth rack and a pinion engaging into the tooth rack.

14. The shielding box of claim 12 wherein a plurality of guides with lifting studs is arranged along opposite sides of the housing part and wherein a plurality of control sliders is arranged along two opposite sides of the housing part, the linear drive cooperating with the control slider such that they are displaced simultaneously.

15. The shielding box of claim 1 wherein a seal is provided for sealing between the housing parts, the seal being spring-biased.

16. The shielding box of claim 1 wherein the plane along which the first and second housing parts abut at each other in the closed position, is oriented horizontally.

* * * * *